US006051779A

United States Patent [19]

Gammon

[11] Patent Number: 6,051,779

[45] **Date of Patent: *Apr. 18, 2000**

[54] SHIELD CAN WITH INTEGRALLY MOLDED GASKET

[75] Inventor: John Weldon Gammon, Raleigh, N.C.

[73] Assignee: Ericsson Inc., Research Triangle Park, N.C.

[ * ] Notice: This patent issued on a continued prosecution application filed under 37 CFR 1.53(d), and is subject to the twenty year patent term provisions of 35 U.S.C. 154(a)(2).

[21] Appl. No.: 08/752,858

[22] Filed: Nov. 21, 1996

[51] Int. Cl.[7] .......... H05K 9/00

[52] U.S. Cl. .......... 174/35 GC; 174/35 R

[58] Field of Search .......... 174/35 GC, 35 R; 361/816, 818, 753

[56] References Cited

U.S. PATENT DOCUMENTS

| | | | |
|---|---|---|---|
| 4,098,633 | 7/1978 | Kersten | 156/245 |
| 4,575,578 | 3/1986 | Bogan et al. | 174/35 GC |
| 5,068,493 | 11/1991 | Benn, Sr. et al. | 174/35 GC |
| 5,205,751 | 4/1993 | Schwartz et al. | 439/86 |
| 5,633,786 | 5/1997 | Matuszewski et al. | 361/818 |
| 5,717,577 | 2/1998 | Mendolia et al. | 361/818 |

FOREIGN PATENT DOCUMENTS 6 643 551 A1 3/1995 European Pat. Off. .

OTHER PUBLICATIONS

*IBM Technical Disclosure Bulletin* vol. 33, No. 6A, Nov. 1990 Casting Seals for Disk Files, XP000107757 pp. 366–367.

*Primary Examiner*—Kristine Kincaid
*Assistant Examiner*—Hung V Ngo

[57] ABSTRACT

An improved RF shielding device is disclosed. An RF shielding device includes a shield can having sidewalls defining a number of guide tabs thereon enabling the shield can to be inserted within a molding apparatus such that an electrically conductive gasket may be molded directly to the sidewalls of the shield can.

6 Claims, 2 Drawing Sheets

SHIELD CAN WITH INTEGRALLY MOLDED GASKET

BACKGROUND OF THE INVENTION

1. Technical Field of the Invention

The present invention relates to RF shielding applications, and more particularly, to RF shield cans having over molded gaskets.

2. Description of Related Art

In electronic application such as cellular telephones, RFI/EMI shielding is necessary to protect and shield sensitive components from interference generated by other components and external sources. Important design considerations of RF shielding involve minimizing the required board area for the RF shield. This involves consideration of the RF shield footprint, placement accuracy of the RF shield and allowance for component clearances.

Previous methods of connecting RF Shields have included directly soldering the metal shield can to a printed circuit board. While soldering provides an excellent ground contact between the shield and the printed circuit board, this method produces a permanently attached shield can that cannot be readily removed if post-solder assembly or testing is required of the protected circuits. Another method of RF shielding involves the use of electrically conductive adhesive as a bond between the shield and the printed circuit board. However, this approach requires a larger footprint on the printed circuit board to allow an adequate surface area for the adhesive bond.

A final method of shield can connection utilizes a dispensed gasket applied to the edge of the RF shield. A dispensed gasket requires a considerably wider width than the can sidewall to allow for adequate bond surface and to compensate for variation in the position of the sidewall location. Current dispensing technology requires the gasket bead to overlap both sides of a thin sidewall to stabilize and harden properly. The gasket width must be further enlarged to accommodate sidewall positioning tolerances and dispensing process tolerances. This occupies a larger area on the printed circuit board, reducing the amount of available space for components.

SUMMARY OF THE INVENTION

The present invention overcomes the foregoing and other problems with an improved RF shielding apparatus. The apparatus consists of an RF shield can having a top surface and sidewalls extending from the peripheral edge of the top surface. The sidewalls define a number of guide tabs enabling the shield can to be aligned with a gasket molding apparatus into which the sidewalls of the shield can are inserted. Once the sidewalls of the shield can have been inserted into a molding apparatus a gasket molding procedure directly molds an electrically conductive gasket to the sidewalls of the shield can. The gasket has a fixed geometry (width and shape) that is not dependent on variations in positioning of the sidewall of the RF shield can.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE PRESENT INVENTION

Figure 1:
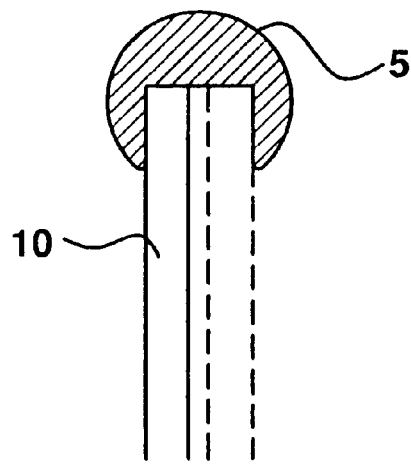
FIG. 1 is an in view of a prior art embodiment of a dispensed gasket.

Referring now to the drawings, and more particularly to FIG. 1, wherein there is illustrated a prior art embodiment of a dispensed gasket 5 along the edge of a shield can sidewall 10. The dispensed gasket process, required the gasket 5 overlap both sides of the sidewall 10 to bond properly. The width of the gasket 5 must also insure that the overlap accounts for variations in the sidewall 10 position.

Figure 2:
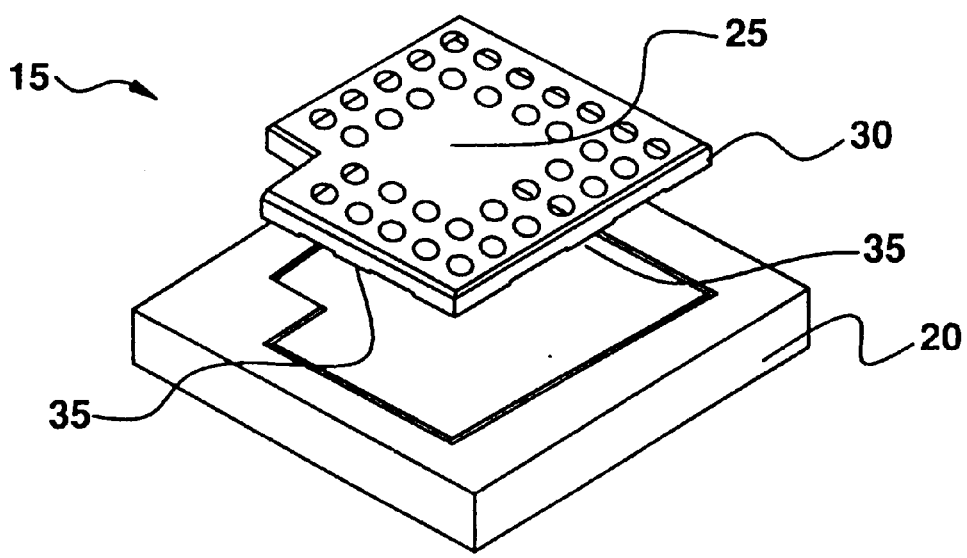
FIG. 2 is an exploded perspective view of an RF shield can with a gasket molding apparatus.

Referring now to FIG. 2 there is illustrated an RF shield can 15 and gasket molding apparatus 20. The RF shield can 15 includes a top surface 25 and sidewalls 30 extending downwardly therefrom. The downwardly extending sidewalls 30 define a number of alignment tabs 35 for properly aligning the shield can 15 with the gasket molding apparatus 20. While FIG. 2 has been illustrated showing the use of alignment tabs 35, it should be realized that the tabs are not necessary, and the shield can 15 may be aligned within the gasket molding apparatus 20 utilizing manual means, vision systems or any other means for properly aligning the shield can 15.

Figure 3A:
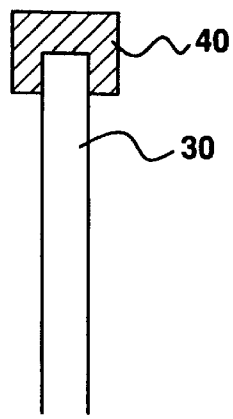
FIGS. 3a–3c illustrate end views of a gasket and sidewall.
Figure 3B:
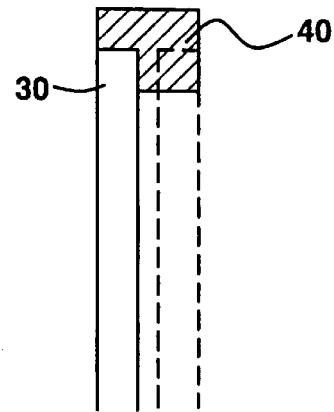
Figure 3C:
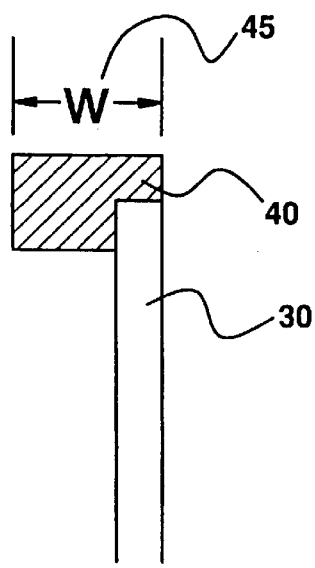

The shield can 15 is placed within the gasket molding apparatus 20 such that a gasket may be over molded along the edges of the sidewall 30. The molding process utilized may include a liquid injection molding, silicone rubber injection over molding or other suitable process. The over-molded gasket material will comprise any electrically conductive material sufficient for maintaining a low conductive resistance interface between the RF shield and the printed circuit board. By over molding the gasket directly to the sidewalls 30 of the shield can 15 using molding apparatus 20, the width of the gasket 40 is fixed at a substantially constant distance as shown generally in FIGS. 3a through 3c. Since the sidewalls 30 of the shield can 15 are aligned within the mold of the gasket molding apparatus 20, variances in the sidewall position are automatically accounted for within the gasket. As can be seen in FIGS. 3a through 3c, no matter where the sidewall 30 may be positioned, the sidewall will always rest within the width 45 of the molded gasket 40 because the gasket is molded directly to the edge of the sidewall within the gasket molding apparatus 20. This allows the width of the gasket 40 to be substantially reduced from those of prior art embodiments and reduce the printed circuit board area required for the shield can 15 and gasket 40.

Figure 4:
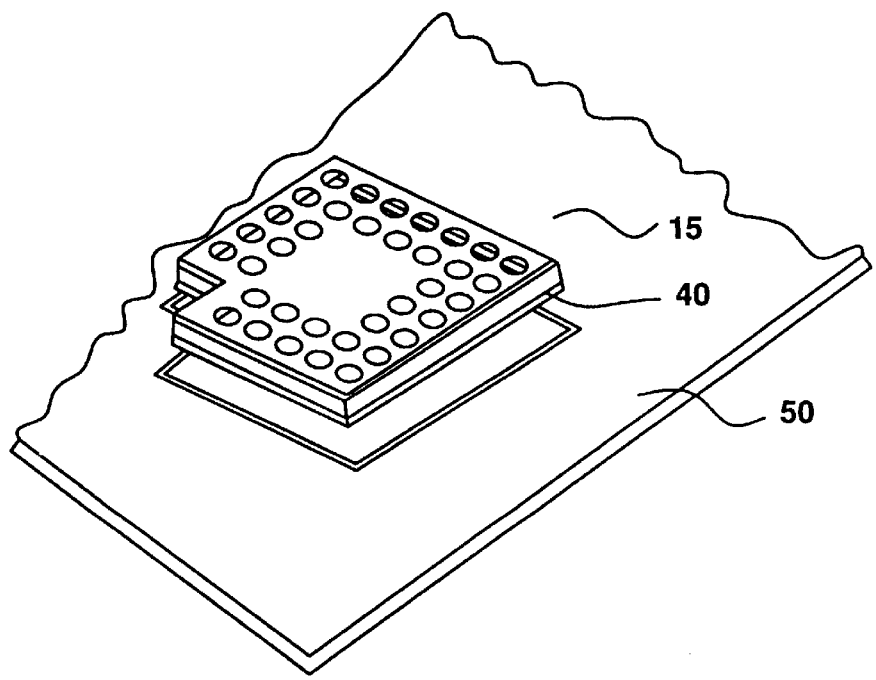
FIG. 4 is a perspective view of a shield can with a molded gasket thereon.

FIG. 4 illustrates the shield can 15 with the over-molded gasket 40. As can be seen, the gasket 40 has a much higher placement accuracy in smaller geometry area than the dispensed gasket for the prior art illustrated in FIG. 1. Reduction of the gasket outline width reduces the area required for placement of the shield can 15 on the printed circuit board 50 and reduces the tolerances that must be maintained for adjacent components or RF shields.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A shield can for shielding components on a printed circuit board from electromagnetic interference, comprising:

a shield can plate having a peripheral edge thereon;

a sidewall extending from the shield can plate and having a first end connected to the peripheral edge of the shield can plate and a second end defining at least one tab integrally formed with the second end of the sidewall and extending parallel therefrom for aligning the shield can with a gasket mold, wherein the second end of the sidewall further has a known position variance with respect to the shield can plate; and a gasket integrally fitted to an edge of the second end of the sidewall, wherein the gasket has a predefined shape with a width fixed at a substantially constant distance independent of variations in position of the second end of the sidewall, wherein the distance is approximately equal to the known position variance of the second end of the sidewall.

2. The apparatus of claim 1 wherein the gasket is composed of an electrically conductive material.

3. A shield can, comprising:

a shield can plate for protecting circuitry on a printed circuit board from RF energies;

a sidewall extending from the shield can plate having a first end connected to an edge of the shield can plate, wherein a second end of the sidewall has a known position variance with respect to the shield can plate; and a gasket integrally fitted to an edge of the second end of the sidewall, the gasket providing a low conductive resistance interfaced with the printed circuit board, the gasket further has a predefined shape with a width fixed at a substantially constant distance independent of variations in position of the second end of the sidewall, wherein the distance is approximately equal to the known position variance of the second end of the sidewall.

4. The apparatus of claim 3 further including a plurality of tabs integrally formed with the second end of the sidewall.

5. The apparatus of claim 3 wherein the gasket is composed of an electrically conductive material.

6. A shield can, comprising:

a shield can plate for protecting circuitry from RF energies;

a sidewall extending from the shield can plate having a first end connected to an edge of the shield can plate;

a plurality of tabs integrally formed with a second end of the sidewall for aligning the sidewall with a gasket molding apparatus, wherein the second end of the sidewall has a known position variance with respect to the shield can plate; and a gasket integrally fitted to an edge of the second end of the sidewall, the gasket providing a surface for engaging a printed circuit board, the gasket further has a predefined shape with a width fixed at a substantially constant distance independent of variations in position of the second end of the sidewall, wherein the distance is approximately equal to the known position variance of the second end of the sidewall.

* * * * *